(12) United States Patent
Lai et al.

(10) Patent No.: US 9,721,883 B1
(45) Date of Patent: Aug. 1, 2017

(54) INTEGRATED CIRCUIT AND MANUFACTURING METHOD THEREOF

(71) Applicant: Taiwan Semiconductor Manufacturing Co., Ltd., Hsinchu (TW)

(72) Inventors: Wen-Lung Lai, Taichung (TW);
Chen-Chieh Chiang, Kaohsiung (TW);
Chi-Cherng Jeng, Tainan (TW);
Shiu-Ko JangJian, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/060,612

(22) Filed: Mar. 4, 2016

(51) Int. Cl.
| *H01L 23/52* | (2006.01) |
| *H01L 23/522* | (2006.01) |
| *H01L 23/528* | (2006.01) |
| *H01L 21/683* | (2006.01) |
| *H01L 21/768* | (2006.01) |

(52) U.S. Cl.
CPC ...... *H01L 23/5226* (2013.01); *H01L 21/6835* (2013.01); *H01L 21/76802* (2013.01); *H01L 21/76832* (2013.01); *H01L 21/76877* (2013.01); *H01L 23/528* (2013.01)

(58) Field of Classification Search
CPC ... H01L 21/6835; H01L 23/528; H01L 23/5226
USPC .......................................... 438/107, 459, 618
See application file for complete search history.

(56) References Cited

U.S. PATENT DOCUMENTS

| 2007/0155157 A1* | 7/2007 | Chou ............... H01L 21/76802 438/618 |
| 2010/0081232 A1* | 4/2010 | Furman ............... H01L 21/2007 438/107 |

* cited by examiner

*Primary Examiner* — Kenneth Parker
*Assistant Examiner* — Warren H Kilpatrick
(74) *Attorney, Agent, or Firm* — Jianq Chyun IP Office

(57) ABSTRACT

Integrated circuits and manufacturing methods of the same are disclosed. The integrated circuit includes a transistor, a first dielectric layer, an etch stop layer, a first via and a first conductive layer. The first dielectric layer is disposed between the transistor and the etch stop layer. The first via is disposed in the first dielectric layer and the etch stop layer, and electrically connected to the transistor. The first conductive layer is in contact with the first via, wherein the first via is disposed between the first conductive layer and the transistor, and the etch stop layer is aside a portion of the first via adjacent to the first conductive layer.

18 Claims, 7 Drawing Sheets

US 9,721,883 B1

INTEGRATED CIRCUIT AND MANUFACTURING METHOD THEREOF

BACKGROUND

Generally, integrated circuits (ICs) includes individual devices, such as transistors, capacitors, or the like, formed on a substrate. One or more metal layers are then formed over the individual devices to provide connections between the individual devices and to provide connections to external devices. The front-end-of-line (FEOL) is the first portion of IC fabrication where the individual devices (transistors, capacitors, resistors, etc.) are patterned in a wafer. FEOL generally covers everything up to (but not including) the deposition of metal layers. The back end of line (BEOL) is the second portion of IC fabrication where the individual devices get interconnected with wiring or metal layers on the wafer. BEOL generally begins when the first metal layer is deposited on the wafer. It includes contacts, insulating layers, metal layers, and bonding sites for chip-to-package connections.

DETAILED DESCRIPTION

Figure 1:
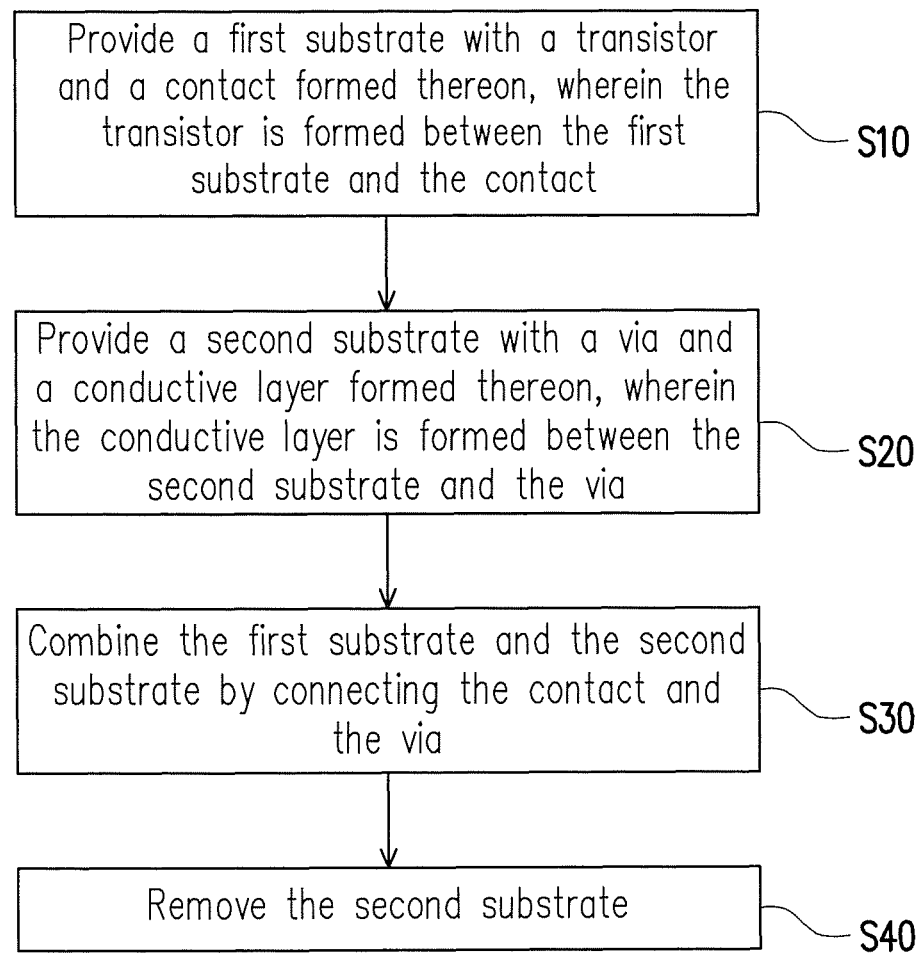
FIG. 1 is a flowchart showing a manufacturing method of an integrated circuit in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "top," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flowchart showing a manufacturing method of an integrated circuit in accordance with some embodiments.

FIG. 2A through FIG. 2D are schematic views showing a manufacturing method of an integrated circuit in accordance with some embodiments.

Figure 2A:
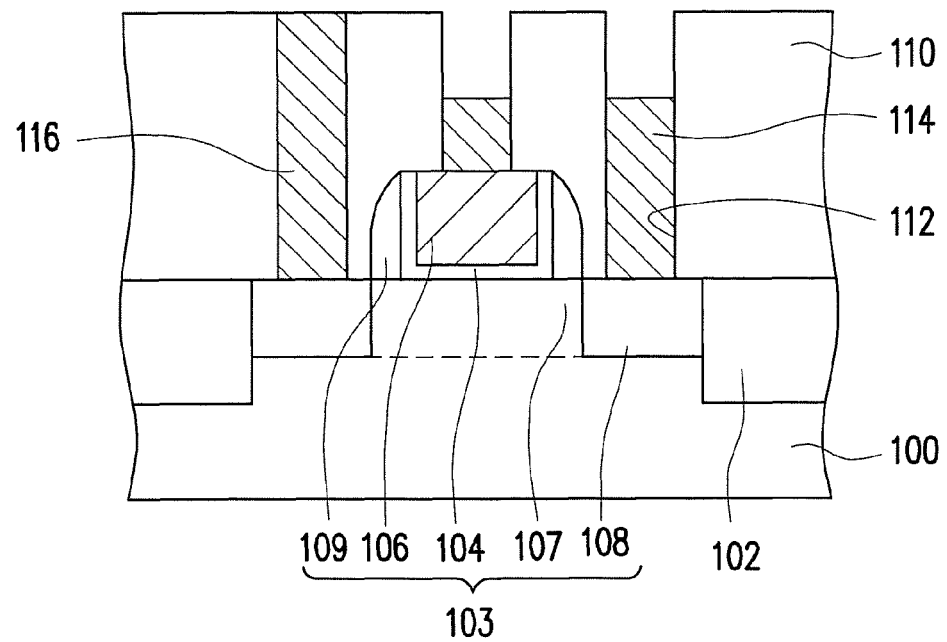
FIG. 2A through FIG. 2D are schematic views showing a manufacturing method of an integrated circuit in accordance with some embodiments.

Referring to FIGS. 1 and 2A, in Step S10, a first substrate 100 with a transistor 103 and a contact 114 formed thereon is provided, wherein the transistor 103 is formed between the first substrate 100 and the contact 114. In some embodiments, the transistor 103 includes a gate 106 and source/drain regions 108. In some embodiments, the first substrate 100 is with one or more fins 107 thereon. In some embodiments, the substrate 100 is a semiconductor substrate, such as a silicon substrate, a silicon-on-insulator (SOI) substrate, a silicon germanium substrate, or a substrate formed of other suitable semiconductor materials. Depending on the requirements of design, the substrate 100 may be a P-type substrate or an N-type substrate and may have doped regions therein. The doped regions may be configured for an N-type FinFET device or a P-type FinFET device. In some embodiments, the first substrate 100 includes isolation structures 102 defining at least one active area, and a gate dielectric layer 104 and the transistor 103 are over the first substrate 100 in the active area. The isolation structures 102 are shallow trench isolation (STI) structures, for example. In some embodiments, the gate dielectric layer 104 is formed aside the gate 106. The gate dielectric layer 104 is made of silicon oxide, a high dielectric constant (high-k) material or a combination thereof. In some embodiments, the high-k material has a dielectric constant of greater than about 4 or even greater than about 10. In some embodiments, the high-k material includes metal oxide, such as titanium oxide ($TiO_2$), zirconium oxide ($ZrO_2$), hafnium oxide ($HfO_2$), tantalum oxide ($Ta_2O_5$), and barium and strontium titanium oxide (($Ba,Sr$)$TiO_3$) or a combination thereof. In some embodiments, the gate 106 is a metal gate including metal, metal alloy, metal silicide or a combination thereof. In alternative embodiments, the gate 106 is a polysilicon gate. In some embodiments, spacers 109 are formed on a sidewall of the gate 106. In some embodiments, the source/drain regions 108 are formed in the first substrate 100 beside the gate 106. In some embodiments, the source/drain regions 108 include epitaxial layers (e.g., SiGe or SiC) and/or doped regions therein. In alternative embodiments, a contact etch stop layer (CESL) is further formed over the gate 106 and the source/drain regions 108. The CESL may include commonly used dielectric materials, such as silicon nitride, silicon oxynitride, silicon oxycarbide, silicon carbide, combinations thereof, and multi-layers thereof. Besides stopping an etching process, CESL also applies a stress to the channel regions of the respective MOS devices. For example, CESL portion, which is in NMOS device region, has a tensile stress, while CESL portion, which is in PMOS device region, has a compressive stress. CESL may be closely located to the channel regions to efficiently supply stresses to the channel regions of the respective MOS devices.

In some embodiments, a dielectric layer 110, e.g., an inter-layer dielectric (ILD) layer, is formed over the transistor 103 and the first substrate 100. In some embodiments, at least one opening 112 is formed in the dielectric layer 110 to expose the transistor 103. Then, a contact 114 is formed in a portion of the opening 112, wherein a depth of the opening 112 is larger than a height of the contact 114 so that the opening 112 is partially filled. In other words, a surface of the contact 114 is, for example, lower than a surface of the dielectric layer 110, wherein the surface of the contact 114 and the surface of the dielectric layer 110 are exposed. In some embodiments, the contact 114 is in contact with at least one of the gate 106 and the source/drain regions 108. In some embodiments, the contacts 114 are in contact with the gate 106 and one of the source/drain regions 108, for example. In some embodiments, the contact 114 includes conductive material such as W, Cu, Al or an alloy thereof. In some embodiments, the contact 114 is formed by forming a conductive material layer over the dielectric layer 110 and filling in the opening 112 by suitable processes such as plating, chemical vapor deposition (CVD), physical vapor deposition (PVD) and/or the like, removing the conductive material layer outside the opening 112 by suitable processes such as CMP, etching and/or the like, and then removing a portion of the conductive material in the opening 112 by suitable processes such as etchback. In some embodiments, a contact 116 is formed and fills in the opening 112, and the forming of the contact 116 is similar to the forming of the contact 114 except that the contact 116 fills in the opening of the dielectric layer 110. In some embodiments, the contact 116 is in contact with the other of the source/drain regions 108, for example.

The process forming the devices 104 such as transistor and other devices such as capacitor, resistor, diode, photodiode, fuse, STI, and the like, within the first substrate 100 and the dielectric layer 110 may be collectively referred as the front-end-of-line (FEOL) process, which is the first portion of IC fabrication. FEOL generally covers everything up to (but not including) the deposition of conductive layers. In some embodiment, FEOL is performed on the first substrate 100.

Figure 2B:
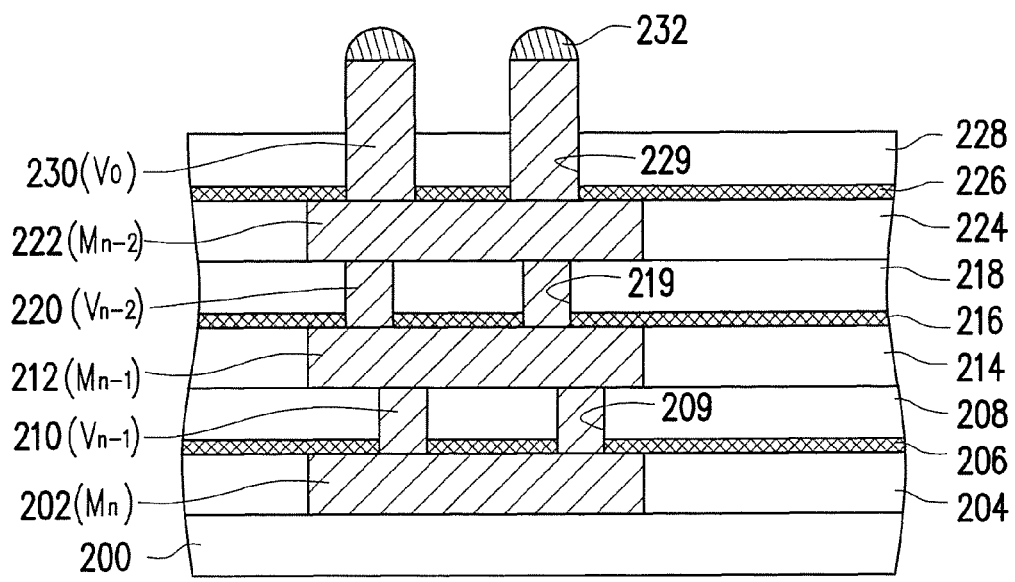

Referring to FIGS. 1 and 2B, in Step S20, a second substrate 200 with a via 230 and a conductive layer 202 formed thereon is provided, wherein the conductive layer 202 is formed between the second substrate 200 and the via 230. In some embodiment, one of the contact 114 and the via 230 has a conductive interlayer 232 thereon, and a surface of the other of the contact 114 and the via 230 is exposed. In some embodiment, the via 230 has the conductive interlayer 232 thereon, and the surface of the contact 114 is exposed. In some embodiments, a plurality of conductive layers 202, 212, 222 and a plurality of vias 210, 220, 230 between the conductive layers 202, 212, 222 are formed over the second substrate 200. In some embodiments, first, the conductive layer 202, also referred to the conductive layer $M_n$, is formed in a dielectric layer 204 over the second substrate 200 and in contact with the second substrate 200, for example. Then, the conductive layers 212, 222, also referred to the conductive layer $M_{n-1}$ and $M_{n-2}$, and the vias 210, 220, also referred to the vias $V_{n-1}$ and $V_{n-2}$, between the conductive layers 202, 212, 222 are formed over the conductive layer 202. Thereafter, the via 230, also referred to the via $V_0$, is formed over the conductive layer 222. In some embodiment, n is a positive integrate larger than 2. In some embodiment, n is 3, for example. In some embodiments, the conductive layers 212, 222 are respectively formed in dielectric layers 214, 224. In some embodiments, the vias 210, 220, 230 are respectively formed in etch stop layers 206, 216, 226 and the dielectric layers 208, 218, 228. In detail, the etch stop layer 206, 216, 226 is formed over the conductive layer 202, 212, 222 and the dielectric layer 208, 218, 228 is formed over the etch stop layer 206, 216, 226. The opening 209, 219, 229 is formed in the etch stop layer 206, 216, 226 and the dielectric layer 208, 218, 228. Then, the via 210, 220, 230 is formed in the opening 209, 219, 229. In some embodiment, the via 210, 220 between the two conductive layers 202, 212, 222 fills in the opening 209, 219, for example. However, the outermost via 230 (the via $V_0$) protrudes from the opening 229 of the etch stop layer 226 and the dielectric layer 228. In some embodiment, after forming the via 230 filling in an opening of a dielectric material layer (not shown in FIG. 2C), a portion of the dielectric material layer with the opening is removed by suitable processes such as etchback, and thus the dielectric layer 228 with the opening 229 is formed, and the via 230 protrudes from the opening 229. In some embodiments, the height of the via 230 is larger than the depth of the opening 229, for example. In some embodiments, a diameter of the opening 229 of the dielectric layer 228 is substantially equal to a diameter of the opening 112 of the dielectric layer 110.

In some embodiments, the second substrate 200 includes an elementary semiconductor such as silicon or germanium and/or a compound semiconductor such as silicon germanium, silicon carbide, gallium arsenic, indium arsenide, gallium nitride or indium phosphide. In some embodiments, each of the vias 210, 220, 230 and the conductive layers 202, 212, 222 includes a metal material such as Cu, Al or an alloy thereof and is formed by a suitable process such as plating or CVD. The number of the conductive layers 202, 212, 222 and the number of the via 210, 220 connecting the conductive layers 202, 212, 222 are only for illustrative purposes and are not limiting. There could be other number of layers that is more or less than the 3 conductive layers shown in FIG. 2B.

In some embodiments, the conductive interlayer 232 may include a low melting point material such as a low melting point metal. The low melting point metal has a melting point lower than the contact 114 and the via 230, such as lower than 400° C. In some embodiments, the low melting point metal has a melting point ranging from 200° C. to 300° C., for example, and the low melting point metal is copper (Cu), aluminum (Al), tin (Sn), gold (Au), bismuth (Bi), lead (Pb), indium (In) or a combination thereof, for example. In some embodiments, the material of the conductive interlayer 232 may have a coefficient of thermal expansion (CTE) and a lattice constant similar to the via 230 and the contact 114.

In some embodiments, each of the dielectric layers 110, 208, 218, 228 may include a low dielectric constant (low-k) material, a nitride such as silicon nitride, an oxide such as silicon oxide, TEOS, high-density plasma (HDP) oxide, plasma-enhanced TEOS (PETEOS), spin-on glass (SOG), fluorinated silicate glass (FSG), undoped silicate glass (USG), phosphosilicate glass (PSG), borosilicate glass (BSG), boron-doped phosphosilicate glass (BPSG), or a combination thereof. In some embodiments, the low-k material has a dielectric constant of less than about 4 or even less than about 3. In some embodiments, the low-k material includes a polymer based material, such as benzocyclobutene (BCB), FLARE®, or SILK; or a silicon dioxide based material, such as hydrogen silsesquioxane (HSQ) or SiOF. In some embodiments, one or more of the dielectric layers 110, 208, 218, 228 include multiple dielectric materials. Each of the dielectric layers 110, 208, 218, 228 is formed by a suitable process such as spin-coating, CVD and/or the like. A planarization process, such as a CMP process, may be performed to planarize the dielectric layers 110, 208, 218, 228. In some embodiments, a thickness of the dielectric layers 110, 208, 218, 228 is from about 300 to about 1200 angstroms, for example. In some embodiments, in addition to signaling the termination point of an etching process, the etch stop layer 206, 216, 226 protects any underlying layer or layers during the etching process. In some embodiments, each of the etch stop layer 206, 216, 226 may include silicon carbide, silicon nitride, TEOS, hard black diamond (HBD), or the like. In some embodiments, the etch stop layer 206, 216, 226 may be formed by depositing and annealing a metal oxide material, which may include hafnium, hafnium oxide (HfO2), or aluminum.

In general, following the FEOL process is the back end of line (BEOL) process, which is the second portion of IC fabrication where the individual devices are interconnected with wiring or conductive layers. The BEOL process generally includes contacts, dielectric layers, conductive layers, and bonding sites for chip-to-package connections. A typical IC may include three or more conductive layers. In some embodiment, the BEOL process is performed on the second substrate 200.

Figure 2C:
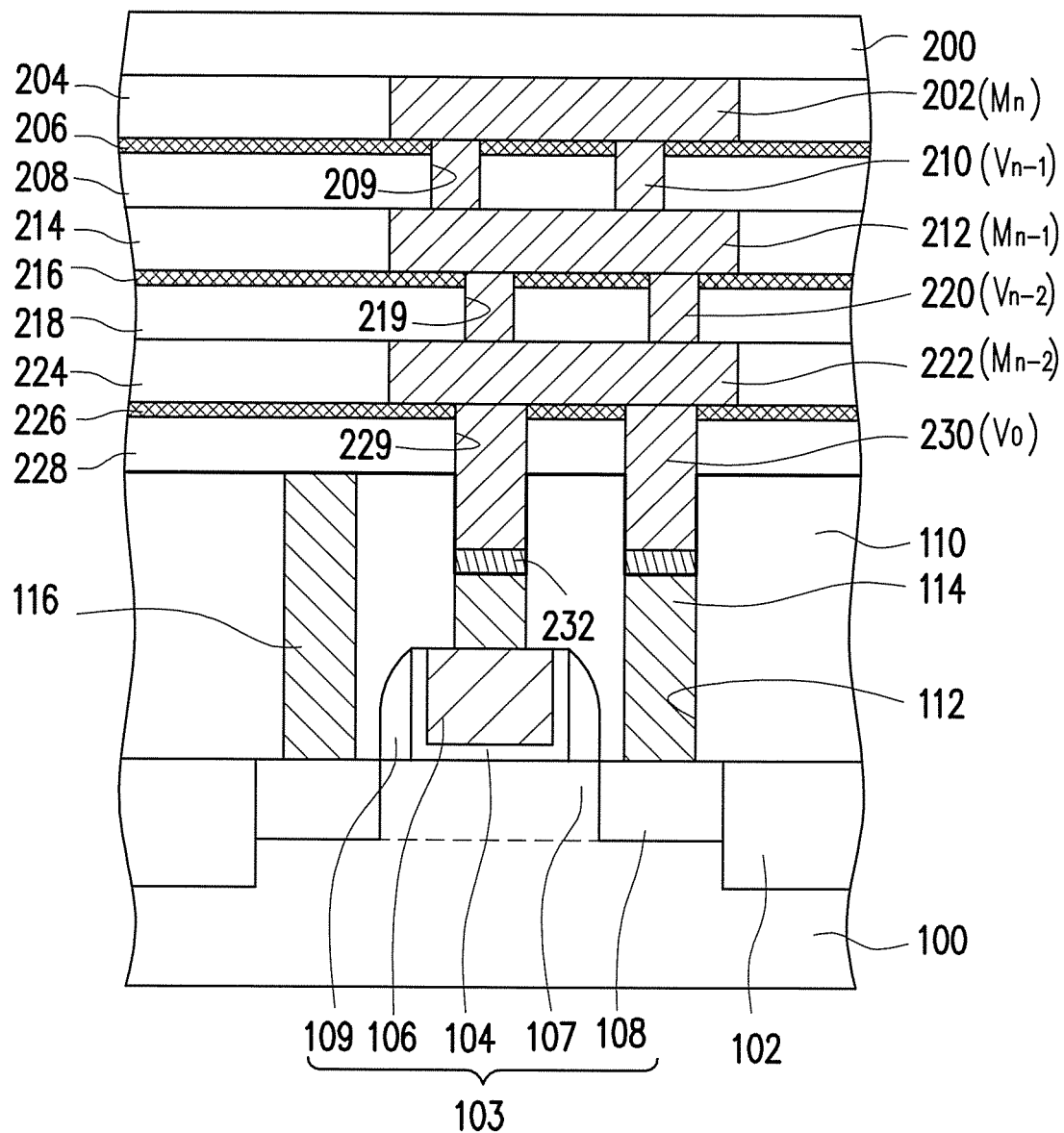

Referring to FIGS. 1 and 2C, in Step S30, the first substrate 100 and the second substrate 200 are combined by connecting the contact 114 and the via 230. In some embodiments, the contact 114 and the via 230 are connected through the conductive interlayer 232 therebetween. In some embodiments, the via 230 is aligned with and inserted into the opening 112 of the dielectric layer 110, and the conductive interlayer 232 is in contact with the contact 114. In some embodiments, the contact 114 is disposed in a portion of the dielectric layer 110, and the via 230 penetrates through the etch stop layer 226 and the dielectric layer 228 and extends into the dielectric layer 110. In some embodiments, the second substrate 200 is turned over and the second substrate 200 and the first substrate 100 are combined in a face-to-face alignment, where a frontside (e.g., the via 230 side) of the second substrate 200 faces a frontside (e.g., the contact 114 side) of the first substrate 100. In some embodiments, the dielectric layer 110 may form a bond such as an oxide-to-oxide bond with the dielectric layer 228. In some embodiments, a temperature of the combining process depends on the melting point of the conductive interlayer 232. In some embodiments, the temperature of the combining process is lower than 400° C., for example. In some embodiments, the temperature of the combining process ranges from 200° C. to 300° C., for example. In some embodiments, the conductive interlayer 232 is welded with the exposed surface of the contact 114, and thus the contact 114 and the via 230 are electrically connected through the conductive interlayer 232.

Figure 2D:
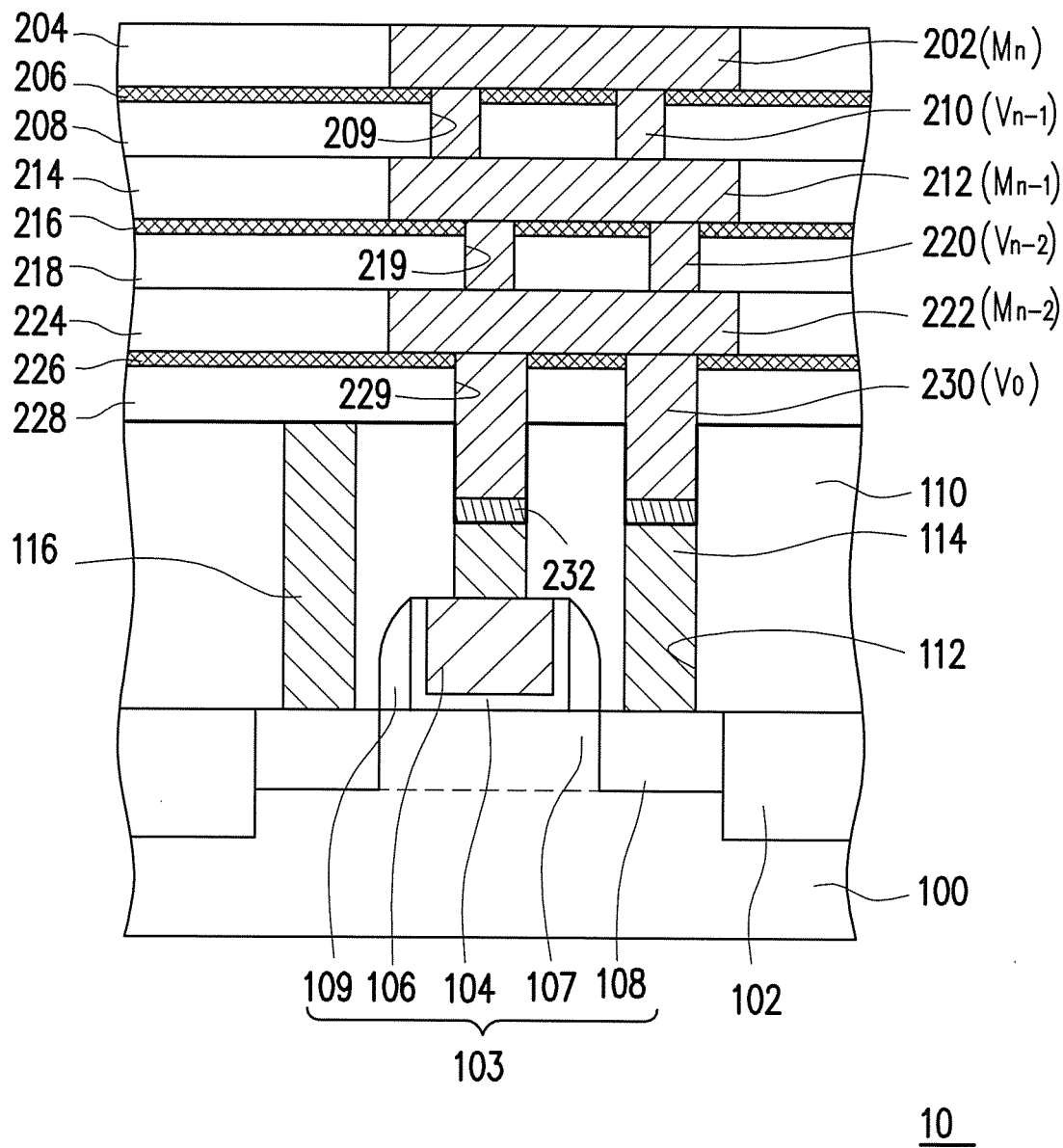

Referring to FIGS. 1 and 2D, in Step S40, the second substrate 200 is removed. In some embodiments, the second substrate 200 may be removed using a backside grinding, CMP or etching process, for example. In an alternative embodiments, a final passivation layer may be formed over the first substrate 100. The final passivation layer may be used for protecting the IC from mechanical abrasion during probe and packaging and to provide a barrier to contaminants. After the final passivation layer, the bond pads for input/output will be opened, followed by the normal post-fabrication process such as wafer probe, die separation, and packaging. After that, an integrated circuit 10 is finished. In the integrated circuit 10 of some embodiment, in a direction along which the transistor 103 and the interconnects including the conductive layers 202, 212, 222 and the vias 210, 220, 230 stack, the via 230 (the via $V_0$), the conductive layer 222 (the conductive layer $M_{n-2}$), the via 220 (the via $V_{n-2}$), the conductive layer 212 (the conductive layer $M_{n-1}$), the via 230 (the via $V_{n-1}$) and the conductive layer 202 (the conductive layer MO are sequentially disposed over the first substrate 100. In some embodiments, the conductive layer 202 (the conductive layer $M_n$) is the outermost metal. In some embodiments, the etch stop layer is disposed aside the top portion of the via $V_{n-1}$, wherein the top portion is the portion in contact with and adjacent to the conductive layer $M_n$ as the via $V_{n-1}$ is disposed between the conductive layer $M_{n-1}$ and the conductive layer $M_n$.

Figure 3A:
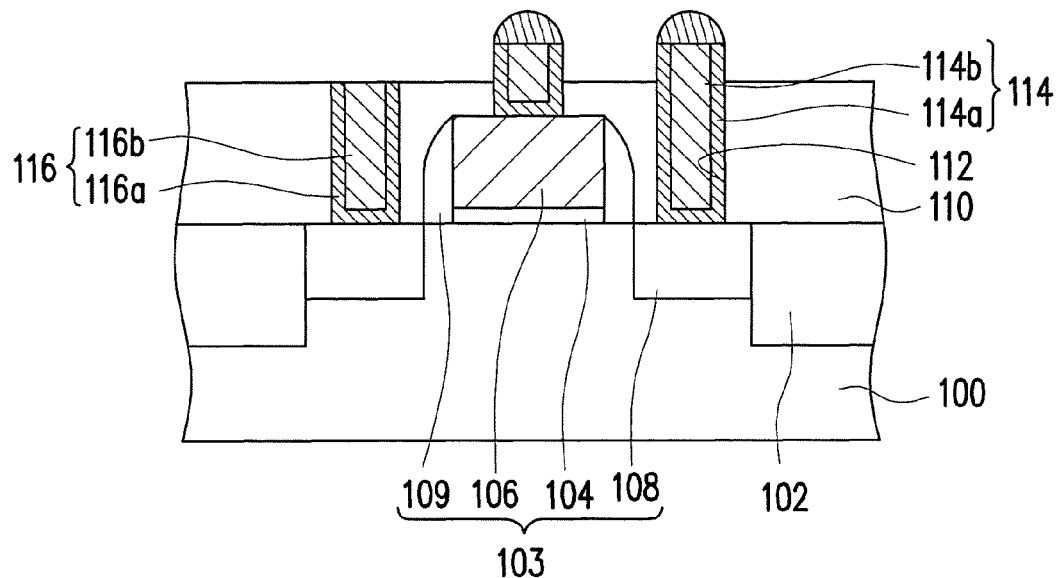
FIG. 3A through FIG. 3D are schematic views showing a manufacturing method of an integrated circuit in accordance with some embodiments.

FIG. 3A through FIG. 3D are schematic views showing a manufacturing method of an integrated circuit in accordance with some embodiments. Referring to FIGS. 1 and 3A, in Step S10, a first substrate 100 with a transistor 103 and a contact 114 formed thereon is provided. In some embodiments, the transistor 103 is a planar transistor, for example. In some embodiments, the transistor 103 includes a gate 106, source/drain regions 108, a gate dielectric layer 104 between the gate 106 and the first substrate 110, and spacers 109. In some embodiments, the contact 114 protrudes from a dielectric layer 110, and a conductive interlayer 232 is formed over the contact 114. In some embodiments, at least one of the contacts 114, 116 includes a diffusion barrier layer 114a, 116a and a metal layer 114b, 116b, and the diffusion barrier layer 114a, 116a is aside and below the metal layer 114b, 116b, for example. The diffusion barrier layer 114a, 116a includes TiW, Ti, TiN, Ta, TaN or a combination thereof, and the metal layer 114b, 116b includes W, Cu, Al or an alloy thereof, for example.

Figure 3B:
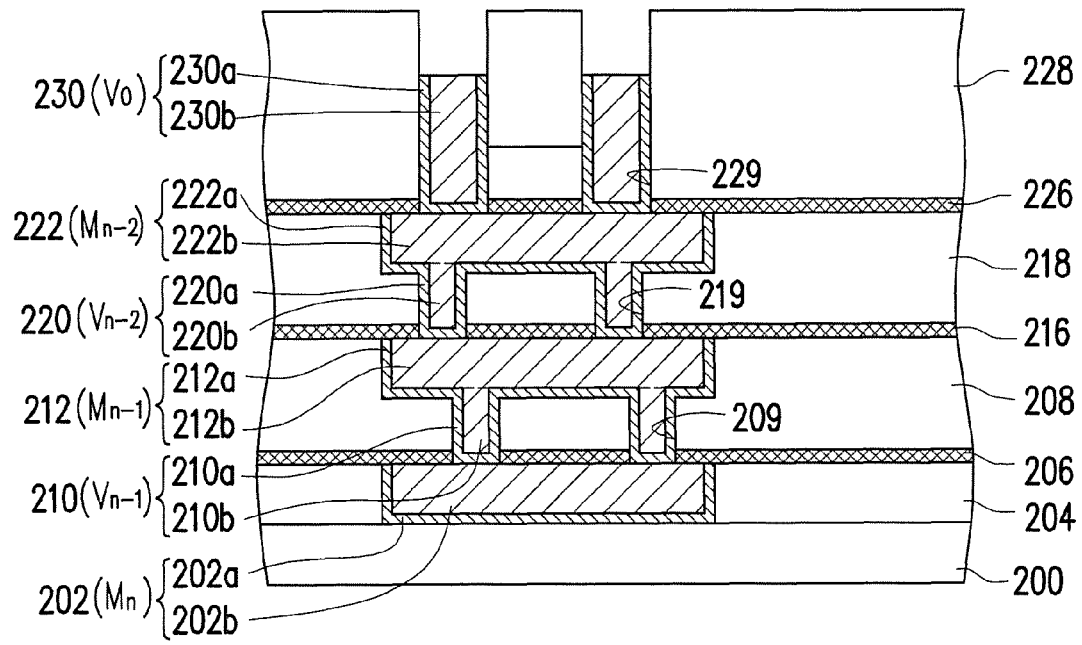

Referring to FIGS. 1 and 3B, in Step S20, a second substrate 200 with a via 230 and a conductive layer 202 formed thereon is provided. In some embodiment, a depth of an opening 229 is larger than a height of the via 230 so that the opening 229 is partially filled with the via 230. The top surface of the via 230 is exposed, for example. In some embodiments, at least one of the vias 210, 220, 230 and conductive layers 202, 212, 222 includes a diffusion barrier layer 202a, 210a, 212a, 220a, 222a, 230a and a metal layer 202b, 210b, 212b, 220b, 222b, 230b, wherein the diffusion barrier layer 202a, 210a, 212a, 220a, 222a, 230a is aside and below the metal layer 202b, 210b, 212b, 220b, 222b, 230b, for example. The diffusion barrier layer 202a, 210a, 212a, 220a, 222a, 230a includes TiW, Ti, TiN, Ta, TaN or a combination thereof, and the metal layer 202b, 210b, 212b, 220b, 222b, 230b includes W, Cu, Al or an alloy thereof, for example.

In alternative embodiments, the conductive layers 202, 212, 222 and the vias 210, 220, 230 may be formed, using a plating, chemical vapor deposition (CVD), physical vapor deposition (PVD) and/or the like and etching process through a damascene or dual-damascene process, in which openings are etched into the corresponding dielectric layer and the and the openings are filled with a conductive material such as Cu. A damascene process which creates either only trenches for the conductive layers or via openings for the vias is known as a single damascene process. A damascene process which creates both trenches and via openings at once is known as a dual damascene process. In some embodiment, the via 210, 220 and the conductive layer 212, 222 over and in contact with the via 210, 220 are integratedly formed, by a dual-damascene process, for example. In other words, the via 210, 220 and the conductive layer 212, 222 are formed in the same opening 209, 219 of a dielectric layer 208, 218. In some embodiment, the dielectric layer 208, 218 is formed over the second substrate 200, and the opening 209, 219 is formed in the dielectric layer 208, 218, and then diffusion barrier material layer and metal material layer are sequentially formed on the sidewall of the opening 209, 219. In alternative embodiment, the diffusion barrier material layer may be omitted. In some embodiment, the via 230 is formed by forming a diffusion barrier material layer and a conductive material layer over an etch stop layer 226 and a dielectric layer 228 and filling in an opening 229, removing the diffusion barrier material layer and the conductive material layer outside the opening 229, and then removing a portion of the barrier material layer and the conductive material in the opening 229.

Figure 3C:
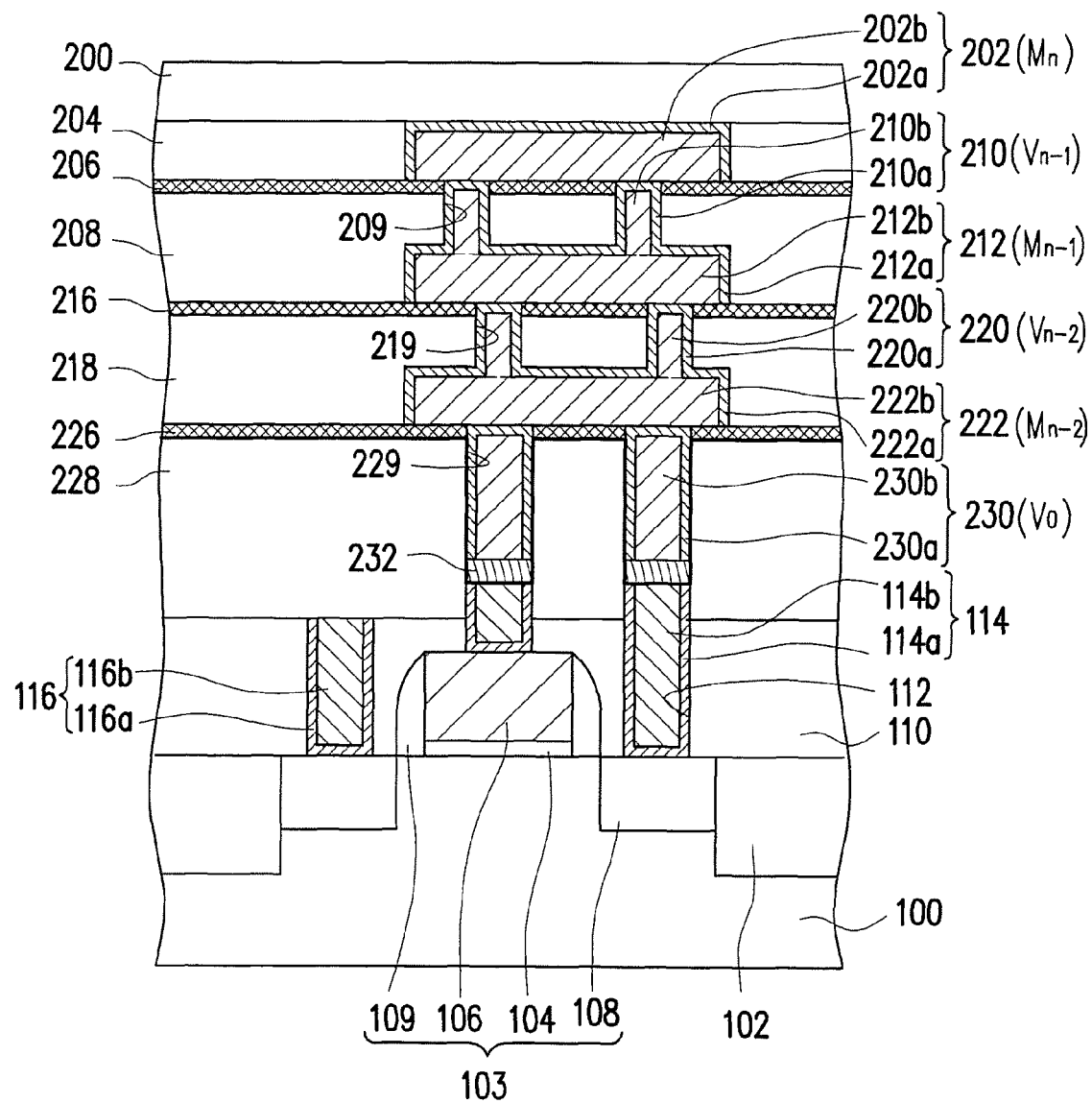

Referring to FIGS. 1 and 3C, in Step S30, the first substrate 100 and the second substrate 200 are combined by connecting the contact 114 and the via 230. In some embodiments, the contact 114 is aligned with and inserted into the opening 229 of the dielectric layer 228 and the etch stop layer 226, and the conductive interlayer 232 is in contact with the via 230.

Figure 3D:
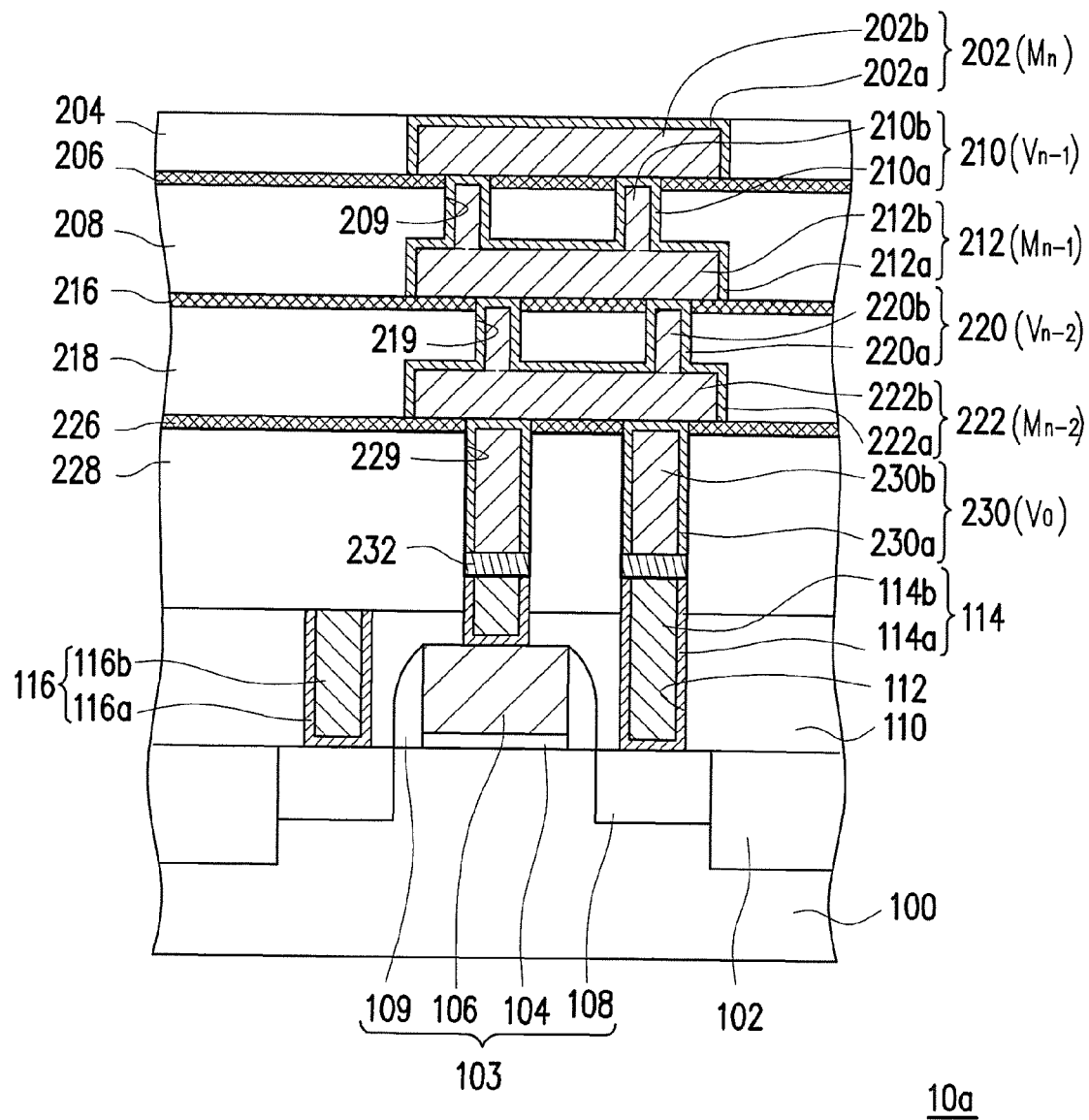

Referring to FIGS. 1 and 3D, in Step S40, the second substrate 200 is removed. In an integrated circuit 10a, the contact 114 penetrates through the dielectric layer 110 and extends into the dielectric layer 228, and the via 230 is disposed in a portion of the dielectric layer 228. In a direction along which the transistor 103 and the interconnects including the conductive layers 202, 212, 222 and the vias 210, 220, 230 stack, the via 230 (the via $V_0$), the conductive layer 222 (the conductive layer $M_{n-2}$), the via 220 (the via $V_{n-2}$), the conductive layer 212 (the conductive layer $M_{n-1}$), the via 230 (the via $V_{n-1}$) and the conductive layer 202 (the conductive layer $M_n$) are sequentially disposed over the first substrate 100. In some embodiments, the via $V_{n-1}$ is disposed between the conductive layer $M_{n-1}$ and the conductive layer $M_n$. In some embodiments, the etch stop layer is disposed aside the top portion of the via $V_{n-1}$, wherein the top portion is the portion in contact with the conductive layer $M_n$. Compared with the conventional interconnect where the diffusion barrier layer of the via $V_{n-1}$ is disposed between the metal layer of the via $V_{n-1}$ and the conductive layer $M_{n-1}$ and in contact with the conductive layer $M_{n-1}$, in some embodiments, the diffusion barrier layer of the via $V_{n-1}$ is disposed between the metal layer of the via $V_{n-1}$ and the conductive layer $M_n$ and in contact with the conductive layer $M_n$. Compared with the conventional interconnect where the diffusion barrier layer of the via $V_{n-1}$ is disposed at an entire interface between the conductive layer $M_{n-1}$ and the metal layer of via $V_{n-1}$ and in contact with the conductive layer $M_{n-1}$, in some embodiments, the diffusion barrier layer of the via $V_{n-1}$ is disposed at an entire interface between the conductive layer $M_n$ and the metal layer of the via $V_{n-1}$ and in contact with the conductive layer $M_n$. Compared with the conventional interconnect where the via $V_{n-1}$ and the conductive layer $M_n$ are integrated formed by a dual-damascene process, in some embodiment, the via $V_{n-1}$ and the conductive layer $M_{n-1}$ are integrated formed by a dual-damascene process.

In some embodiments, the processes for the integrated circuit is split into the FEOL process and the BEOL process, the FEOL process for forming the individual devices (transistors, capacitors, resistors, etc.) is performed on the first substrate, and the BEOL process for forming the interconnects is performed on the second substrate. After the FEOL process and the BEOL process are respectively finished, by connecting the contact over the first substrate and the via over the second substrate, the first substrate and the second substrate are combined, and the integrated circuit is finished after removing the second substrate. Since the interconnects are formed over the second substrate, the forming order of the conductive layers and the vias is reversed with respect to that of the conductive layers and the vias directly forming over the transistors. Thus, the conductive layer first formed over the second substrate will be the outermost conductive layer after the first and second substrates are combined. Additionally, as the via $V_{n-1}$ is disposed between the conductive layer $M_{n-1}$ and the conductive layer $M_n$, the etch stop layer and the diffusion barrier layer are conventionally disposed adjacent to the portion of the via $V_{n-1}$ in contact with the conductive layer $M_{n-1}$, in the integrated circuit of some embodiment, the etch stop layer and the diffusion barrier layer are conventionally disposed adjacent to the portion of the via $V_{n-1}$ in contact with the conductive layer $M_n$. In the integrated circuit of some embodiment, the conductive interlayer is formed between the via and the contact and electrically connects the via and the contact. Furthermore, since the FEOL process and the BEOL process are performed on different substrates, the BEOL process may be performed independent of the FEOL process, and the BEOL process and the FEOL process may be performed simultaneously. Accordingly, the production time and the production cost may be reduced.

An integrated circuit includes a transistor, a first dielectric layer, an etch stop layer, a first via and a first conductive layer. The first dielectric layer is disposed between the transistor and the etch stop layer. The first via is disposed in the first dielectric layer and the etch stop layer, and electrically connected to the transistor. The first conductive layer is in contact with the first via, wherein the first via is disposed between the first conductive layer and the transistor, and the etch stop layer is aside a portion of the first via adjacent to the first conductive layer.

An integrated circuit includes a transistor, a contact, a first via and a conductive interlayer. The contact is disposed over and in contact with the transistor. The first via is disposed over the contact. The conductive interlayer is disposed between and electrically connecting the contact and the first via.

A manufacturing method of an integrated circuit includes the following. A first substrate with a transistor and a contact formed thereon is provided, wherein the transistor is formed between the first substrate and the contact. A second substrate with a first via and a first conductive layer formed thereon is provided, wherein the first conductive layer is formed between the second substrate and the via. The first substrate and the second substrate are combined by connecting the contact and the first via. The second substrate is removed.

The foregoing outlines features of several embodiments so that those skilled in the art may better understand the aspects of the present disclosure. Those skilled in the art should appreciate that they may readily use the present disclosure as a basis for designing or modifying other processes and features for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. An integrated circuit, comprising:
a transistor;
a first dielectric layer and an etch stop layer, wherein the first dielectric layer is disposed between the transistor and the etch stop layer;
a first via, disposed in the first dielectric layer and the etch stop layer, and electrically connected to the transistor; and
a first conductive layer, in contact with the first via, wherein the first via is disposed between the first conductive layer and the transistor, and the etch stop layer is aside a portion of the first via adjacent to the first conductive layer,
wherein the first via includes a metal layer and a diffusion barrier layer, and the diffusion barrier layer is disposed between the metal layer and the first conductive layer and in contact with the first conductive layer.

2. The integrated circuit according to claim 1, further comprising a contact disposed between and in contact with the first via and the transistor.

3. The integrated circuit according to claim 2, wherein the contact is disposed in a second dielectric layer, and the first via penetrates through the etch stop layer and the first dielectric layer and extends into the second dielectric layer.

4. The integrated circuit according to claim 2, wherein the contact is disposed in a second dielectric layer, and the contact penetrates through the second dielectric layer and extends into the first dielectric layer.

5. The integrated circuit according to claim 1, further comprising at least one second conductive layer and at least one second via disposed over and electrically connected to the first conductive layer.

6. An integrated circuit, comprising:
a transistor;
a contact, disposed over and in contact with the transistor;
a first via, disposed over the contact;
a conductive interlayer, disposed between and electrically connecting the contact and the first via; and
a first conductive layer, in contact with the first via, wherein the first via is disposed between the first conductive layer and the transistor.

7. The integrated circuit according to claim 6, wherein the contact is disposed in a first opening of a first dielectric layer, the first via is disposed in a second opening of the second dielectric layer, and the conductive interlayer in disposed in one of the first and second openings.

8. The integrated circuit according to claim 7, further comprising an etch stop layer, wherein the second dielectric layer is disposed between the first dielectric layer and the etch stop layer, the first via is disposed in a second opening of the second dielectric layer and the etch stop layer.

9. The integrated circuit according to claim 7, wherein the first via extends into the first dielectric layer.

10. The integrated circuit according to claim 7, wherein the contact extends into the second dielectric layer.

11. A manufacturing method of an integrated circuit, the manufacturing method comprising:
providing a first substrate with a transistor and a contact formed thereon, wherein the transistor is formed between the first substrate and the contact;
providing a second substrate with a first via and a first conductive layer formed thereon, wherein the first conductive layer is formed between the second substrate and the via;
combining the first substrate and the second substrate by connecting the contact and the first via, wherein the contact is formed in a first opening of a first dielectric layer, the first via is formed in a second opening of a second dielectric layer, one of the first opening and the second opening is partially filled before combining the first substrate and the second substrate, and the first opening and the second opening are filled with the contact and the first via after combining the first substrate and the second substrate; and
removing the second substrate.

12. The manufacturing method according to claim 11, wherein the first opening is partially filled with the contact, and the first via is inserted into the first opening in the step of combining the first substrate and the second substrate.

13. The manufacturing method according to claim 11, wherein the second opening is partially filled with the first via, and the contact is inserted into the second opening in the step of combining the first substrate and the second substrate.

14. The manufacturing method according to claim 11, wherein one of the contact and the first via has a conductive interlayer thereon, a surface of the other of the contact and the first via is exposed, and a method of combining the first substrate and the second substrate is welding the conductive interlayer and the exposed surface.

15. The manufacturing method according to claim 11, wherein a method of providing a second substrate with a first via and a conductive layer formed thereon comprises:
forming the first conductive layer over the second substrate;
forming an etch stop layer and a second dielectric layer over the first conductive layer, wherein the etch stop layer is disposed between the second dielectric layer and the first conductive layer;
forming a second opening in the etch stop layer and the second dielectric layer; and
forming the first via in the second opening.

16. The manufacturing method according to claim 15, further comprising forming at least one second via and at least one second conductive layer between the first via and the first conductive layer.

17. The manufacturing method according to claim 16, wherein the second via and the second conductive layer are formed simultaneously.

18. The manufacturing method according to claim 11, wherein a method of forming the first via comprises:
forming a diffusion barrier layer on a sidewall of a second opening in a second dielectric layer; and
forming a metal layer over the diffusion barrier layer.

* * * * *